United States Patent
Choi

(10) Patent No.: US 9,509,287 B2
(45) Date of Patent: Nov. 29, 2016

(54) INTERNAL VOLTAGE GENERATION CIRCUITS

(71) Applicant: SK hynix Inc., Icheon-si Gyeonggi-do (KR)

(72) Inventor: Min Seok Choi, Seoul (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/703,490

(22) Filed: May 4, 2015

(65) Prior Publication Data

US 2015/0236680 A1 Aug. 20, 2015

Related U.S. Application Data

(62) Division of application No. 13/961,267, filed on Aug. 7, 2013, now Pat. No. 9,047,931.

(30) Foreign Application Priority Data

Apr. 2, 2013 (KR) .................. 10-2013-0035576

(51) Int. Cl.
*H03B 1/00* (2006.01)
*H03K 3/00* (2006.01)
*H03K 3/012* (2006.01)

(52) U.S. Cl.
CPC .................... *H03K 3/012* (2013.01)

(58) Field of Classification Search
USPC .......... 327/2–12, 105–123, 141, 144–163, 327/379, 389, 391, 530–546; 331/15–17; 375/373–376; 323/312–317; 326/22–27, 81–87
See application file for complete search history.

(56) References Cited

U.S. PATENT DOCUMENTS

| | | | | |
|---|---|---|---|---|
| 7,782,079 B2* | 8/2010 | Park | ................... | H03K 19/0005 326/30 |
| 8,421,506 B2* | 4/2013 | Wang | ............... | H03K 19/00384 327/108 |
| 2007/0090883 A1* | 4/2007 | Yang | ...................... | H03L 7/093 331/16 |
| 2009/0146685 A1* | 6/2009 | Kim | ................... | H03K 19/0005 326/33 |
| 2009/0278577 A1* | 11/2009 | Yoon | ................ | H03K 3/356121 327/147 |
| 2010/0156882 A1* | 6/2010 | Lee | .......................... | G09G 3/20 345/213 |
| 2012/0256655 A1* | 10/2012 | Kim | ................ | H03K 19/01855 326/30 |
| 2016/0085249 A1* | 3/2016 | Lim | ...................... | G11C 5/147 365/185.18 |

* cited by examiner

*Primary Examiner* — Brandon S Cole
(74) *Attorney, Agent, or Firm* — William Park & Associates Ltd.

(57) ABSTRACT

Internal voltage generation circuits are provided. The internal voltage generation circuit includes a code signal generator and an internal voltage generator. The code signal generator generates input code signals having a logic level combination corresponding to a difference between a frequency of an external clock signal and a frequency of an internal clock signal. The internal voltage generator is selectively activated according to the logic level combination of the input code signals to drive an internal voltage signal.

10 Claims, 11 Drawing Sheets

FIG. 4

| FREQUENCY DIFFERENCE (Δf) | CNT<2> | CNT<1> | TO<4> | TO<3> | TO<2> | TO<1> |
|---|---|---|---|---|---|---|
| 0MHZ | L | L | L | L | L | H |
| 200MHZ | L | H | L | L | H | H |
| 400MHZ | H | L | L | H | H | H |
| 600MHZ | H | H | H | H | H | H |

INTERNAL VOLTAGE GENERATION CIRCUITS

CROSS-REFERENCES TO RELATED APPLICATIONS

The present application claims priority under 35 U.S.C. 119(a) to Korean Application No. 10-2013-0035576, filed on Apr. 2, 2013, in the Korean Intellectual Property Office, which is incorporated herein by reference in its entirety.

BACKGROUND

In general, semiconductor memory devices generate internal voltages in response to a power supply voltage signal VDD and a ground voltage signal VSS, which are inputted from an external device, to use them in operations of internal circuits constituting the semiconductor memory devices. The internal voltages for operating the internal circuits of the semiconductor memory devices may include a core voltage VCORE for using in a memory core region, a high voltage VPP for word line drive or word line overdrive, and a back-bias voltage VBB applied to a bulk region (e.g., a substrate) of NMOS transistors in the memory core region.

The core voltage VCORE may be a positive voltage which is lower than the power supply voltage signal VDD supplied by the external device. Thus, the core voltage VCORE may be generated by lowering the power supply voltage signal VDD to a certain level. In contrast to the core voltage VCORE, the high voltage VPP may be higher than the power supply voltage signal VDD, and the back-bias voltage VBB may be a negative voltage which is lower than the ground voltage signal VSS. Thus, charge pump circuits may be required to generate the high voltage VPP and the back-bias voltage VBB.

The semiconductor memory devices may operate at a high speed by increasing a frequency of an external clock signal, and the use of the internal voltages may increase when the semiconductor memory devices operate at a high speed. Therefore, the semiconductor memory devices may be so designed as to activate many internal voltage generation circuits when the semiconductor memory devices operate at a high speed.

However, even when the semiconductor memory devices do not operate at a high speed, some internal voltage generation circuits, which are not required to operate, may be still activated, thereby increasing power consumption of the semiconductor memory devices.

SUMMARY

Various embodiments are directed to internal voltage generation circuits.

According to an embodiment of the present invention, an internal voltage generation circuit includes a code signal generator and an internal voltage generator. The code signal generator generates input code signals having a logic level combination corresponding to a difference between a frequency of an external clock signal and a frequency of an internal clock signal. The internal voltage generator is partially activated according to the logic level combination of the input code signals to drive an internal voltage signal.

According to an embodiment of the present invention, an internal voltage generation circuit includes a comparator configured to generate a frequency difference signal whose enable period is controlled according to a frequency difference between an external clock signal and an internal clock signal, and a code converter configured to count logic levels of count signals and generate input code signals from the count signals. The input code signals control a drivability for driving an internal voltage signal.

According to an embodiment of the present invention, an internal voltage generation circuit includes a comparator configured to generate a frequency difference signal whose cycle time is controlled according to a frequency difference between an external clock signal and an internal clock signal, and a code converter configured to generate count signals that are counted whenever the frequency difference signal is toggled and to generate input code signals from the count signals. The input code signals control a drivability for driving an internal voltage signal.

BRIEF DESCRIPTION OF THE DRAWINGS

Embodiments of the inventive concept will become more apparent in view of the attached drawings and accompanying detailed description, in which:

FIG. 4 is a logic table illustrating an operation of the code signal generator of FIG. 2;

DETAILED DESCRIPTION OF THE EMBODIMENTS

Example embodiments of the inventive concept will be described hereinafter with reference to the accompanying drawings. However, the example embodiments described herein are for illustrative purposes only and are not intended to limit the scope of the inventive concept.

Figure 1:
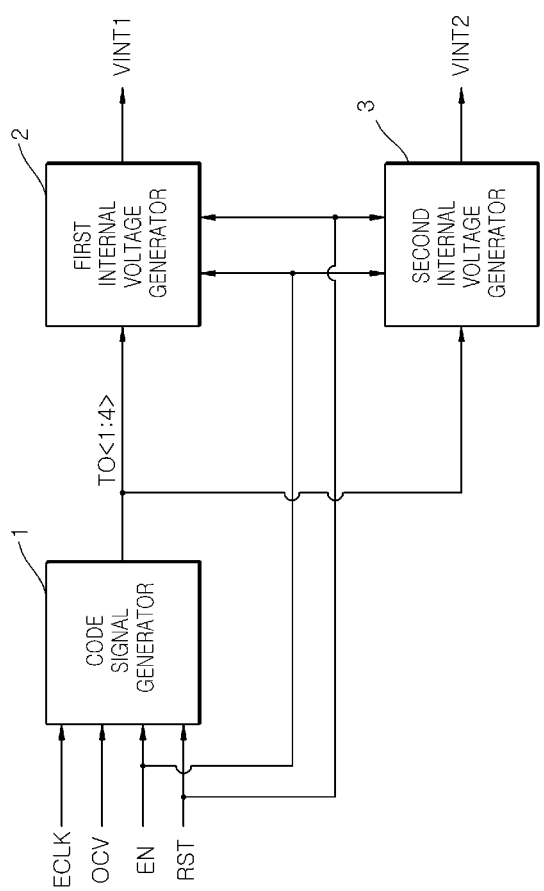
FIG. 1 is a block diagram illustrating a configuration of an internal voltage generation circuit according to an embodiment of the present invention.

As illustrated in FIG. 1, an internal voltage generation circuit according to an example embodiment of the present invention may be configured to include a code signal generator 1, a first internal voltage generator 2 and a second internal voltage generator 3. Although an example embodiment of the present invention illustrated in FIG. 1 includes two internal voltage generators, the internal voltage generation circuit may include three or more internal voltage generators. An enable signal EN and a reset signal RST may be input into the code signal generator 1. The code signal generator 1 may generate a plurality of input code signals, e.g., first to fourth input code signals TO<1:4> having logic levels. A logic level combination of the first to fourth input code signals TO<1:4> may be determined by a difference between a frequency of an external clock signal ECLK and a frequency of an internal clock signal RCLK (see FIG. 2) adjusted according to a level of an input voltage signal OCV. The first internal voltage generator 2 may generate a first internal voltage signal VINT1 which is determined according to logic levels of the first to fourth input code signals TO<1:4>. The first internal voltage signal VINT1 may be a high voltage VPP having a higher voltage level than a power supply voltage signal VDD which is supplied from an external device. The first internal voltage signal VINT1 may also be a back-bias voltage VBB having a negative voltage level which is lower than a ground voltage signal VSS. The first internal voltage signal VINT1 may be generated using a charge pump circuit. The second internal voltage generator 3 may generate a second internal voltage signal VINT2 which is determined according to logic levels of the first to fourth input code signals TO<1:4>. The second internal voltage signal VINT2 may be a core voltage VCORE which is higher than the ground voltage signal VSS and lower than the power supply voltage signal VDD. Thus, the second internal voltage signal VINT2 may be generated by lowering the power supply voltage signal VDD.

Figure 2:
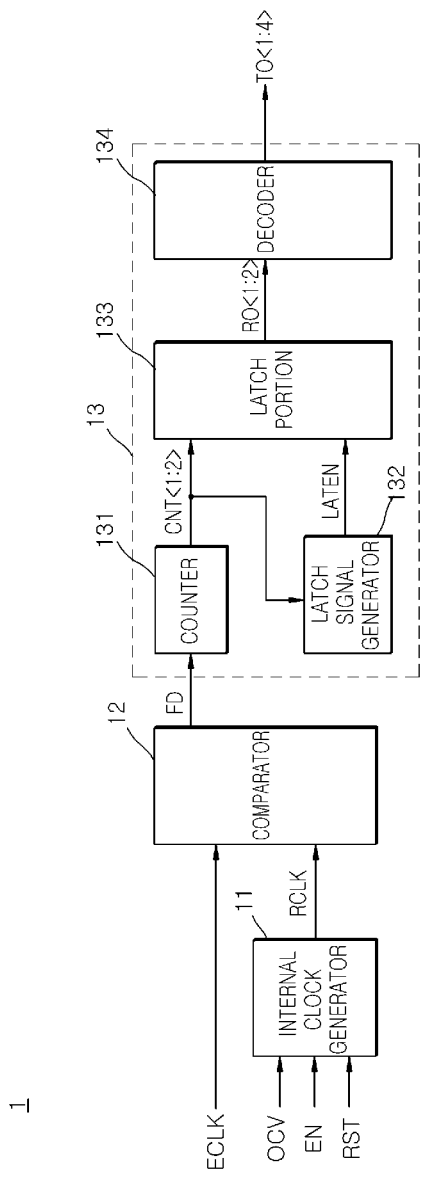
FIG. 2 is a block diagram illustrating an example of a code signal generator included in the internal voltage generation circuit of FIG. 1.

Referring to FIG. 2, the code signal generator 1 may be configured to include an internal clock generator 11, a comparator 12 and a code converter 13. The internal clock generator 11 may generate the internal clock signal RCLK having a frequency which is adjusted according to a level of the input voltage signal OCV. The input voltage signal OCV may be transmitted from an external device such as a controller or a test equipment and may be applied to the internal clock generator 11. In an embodiment of the present invention, the frequency of the internal clock signal RCLK may increase as the level of the input voltage signal OCV increases. In an embodiment of the present invention, the frequency of the internal clock signal RCLK may decrease as the level of the input voltage signal OCV increases. Further, the internal clock generator 11 may initialize the internal clock signal RCLK in response to a reset signal RST. For example, reset signal RST may be inputted to the internal clock generator 11 during a power-up period. The internal clock generator 11 may also operate in response to an enable signal EN which is inputted after the power-up period. In an embodiment of the present invention, the power-up period refers to a period that the power supply voltage signal VDD, for operating a semiconductor memory device including the code signal generator 1, rises from a ground voltage level to a predetermined voltage level.

The comparator 12 may generate a frequency difference signal FD whose enable pulse width is controlled according to a frequency difference between the external clock signal ECLK and the internal clock signal RCLK. In various embodiments of the present invention, the enable pulse width of the frequency difference signal FD increases if the frequency difference between the external clock signal ECLK and the internal clock signal RCLK increases. Further, the comparator 12 may be configured to generate the frequency difference signal FD whose pulse interval is controlled according to the frequency difference between the external clock signal ECLK and the internal clock signal RCLK. In various embodiments of the present invention, the pulse interval of the frequency difference signal FD may decrease as the frequency difference between the external clock signal ECLK and the internal clock signal RCLK increases.

The code converter 13 may output the first to fourth input code signals TO<1:4> in response to first and second count signals CNT<1:2>. The first and second count signals CNT<1:2> may be generated by performing a counting operation during the enable pulse width of the frequency difference signal FD. In an embodiment of the present invention, the code converter 13 may output the first to fourth input code signals TO<1:4> if a logic level combination of the first and second count signals CNT<1:2> corresponds to a predetermined frequency difference between the external clock signal ECLK and the internal clock signal RCLK.

In an embodiment of the present invention, the code converter 13 may be configured to include a counter 131, a latch signal generator 132, a latch portion 133 and a decoder 134. The counter 131 may sequentially output the first and second count signals CNT<1:2> that are generated by performing a counting operation during the enable pulse width of the frequency difference signal FD. In an embodiment of the present invention, the counter 131 may sequentially output the first and second count signals CNT<1:2> that are obtained through a counting operation performing whenever the frequency difference signal FD is toggled. The latch signal generator 132 may generate a latch signal LATEN which is enabled when a logic level combination of the first and second count signals CNT<1:2> corresponds to a predetermined frequency difference between the external clock signal ECLK and the internal clock signal RCLK. In an embodiment of the present invention, the latch signal is enabled when the number of times the same logic level combination of the count signals are repeatedly generated is equal to a predetermined number. The latch portion 133 may latch the first and second count signals CNT<1:2> when the latch signal LATEN is enabled and may output first and second pre-code signals RO<1:2>. In an embodiment of the present invention, the latch portion 133 may output the latched first and second count signals CNT<1:2> as first and second pre-code signals RO<1:2>. The decoder 134 may decode the first and second pre-code signals RO<1:2> to generate the first to fourth input code signals TO<1:4>.

Hereinafter, an operation of the code converter 13 as set forth above will be described with reference to FIGS. 3 and 4 in conjunction with an example that a frequency difference between the external clock signal ECLK and the internal clock signal RCLK is 400 megahertz (MHz). In a graph of FIG. 3, the abscissa represents time t, and the ordinate represents a frequency difference Δf between the external clock signal ECLK and the internal clock signal RCLK.

At a point of time T1, the counter 131 may generate a first count signal CNT<1> having a logic "low (L)" level and a second count signal CNT<2> having a logic "low (L)" level. For example, a logic level combination (L, L) of the first and second count signals CNT<1:2> may correspond to an example where a frequency difference between the external clock signal ECLK and the internal clock signal RCLK is 0 MHz.

At a point of time T2, the counter 131 may increase one bit to generate a first count signal CNT<1> having a logic "high (H)" level and a second count signal CNT<2> having a logic "low (L)" level. For example, a logic level combination (H, L) of the first and second count signals CNT<1:2> corresponds to an example that a frequency difference between the external clock signal ECLK and the internal clock signal RCLK is 200 MHz.

At a point of time T3, the counter 131 may increase one bit to generate a first count signal CNT<1> having a logic "low (L)" level and a second count signal CNT<2> having a logic "high (H)" level. For example, a logic level combination (L, H) of the first and second count signals CNT<1:2> corresponds to an example that a frequency difference between the external clock signal ECLK and the internal clock signal RCLK is 400 MHz.

At a point of time T4, the counter 131 may increase one bit to generate a first count signal CNT<1> having a logic "high (H)" level and a second count signal CNT<2> having a logic "high (H)" level. For example, a logic level combination (H, H) of the first and second count signals CNT<1:2> corresponds to an example that a frequency difference between the external clock signal ECLK and the internal clock signal RCLK is 600 MHz.

At a point of time T5, the counter 131 may decrease one bit to generate a first count signal CNT<1> having a logic "low (L)" level and a second count signal CNT<2> having a logic "high (H)" level. Accordingly, a logic level combination of the first and second count signals CNT<1:2> may return to the example that a frequency difference between the external clock signal ECLK and the internal clock signal RCLK is 400 MHz.

At a point of time T6, the counter 131 may increase one bit to generate a first count signal CNT<1> having a logic "high (H)" level and a second count signal CNT<2> having a logic "high (H)" level. Accordingly, a logic level combination of the first and second count signals CNT<1:2> may return to the example that a frequency difference between the external clock signal ECLK and the internal clock signal RCLK is 600 MHz.

At a point of time T7, the counter 131 may decrease one bit to generate a first count signal CNT<1> having a logic "low (L)" level and a second count signal CNT<2> having a logic "high (H)" level. Accordingly, a logic level combination of the first and second count signals CNT<1:2> may return to the example that a frequency difference between the external clock signal ECLK and the internal clock signal RCLK is 400 MHz.

At a point of time T8, the counter 131 may increase one bit to generate a first count signal CNT<1> having a logic "high (H)" level and a second count signal CNT<2> having a logic "high (H)" level. Accordingly, a logic level combination of the first and second count signals CNT<1:2> may return to the example that a frequency difference between the external clock signal ECLK and the internal clock signal RCLK is 600 MHz.

At a point of time T9, the counter 131 may decrease one bit to generate a first count signal CNT<1> having a logic "low (L)" level and a second count signal CNT<2> having a logic "high (H)" level. Accordingly, a logic level combination of the first and second count signals CNT<1:2> may return to the example that a frequency difference between the external clock signal ECLK and the internal clock signal RCLK is 400 MHz.

As described above, the counter 131 may repeatedly execute an up-counting operation and a down-counting operation of the first and second count signals CNT<1:2> from the point of time T4 to the point of time T9. In an embodiment of the present invention, the logic level combination (L, H) of the first and second count signals CNT<1:2> means that the first count signal CNT<1> has a logic "low" level and the second count signal CNT<2> has a logic "high" level, and the logic level combination (H, L) of the first and second count signals CNT<1:2> means that the first count signal CNT<1> has a logic "high" level and the second count signal CNT<2> has a logic "low" level. Further, the logic level combination (L, L) of the first and second count signals CNT<1:2> means that both the first and second count signals CNT<1:2> have logic "low" levels, and the logic level combination (H, H) of the first and second count signals CNT<1:2> means that both the first and second count signals CNT<1:2> have logic "high" levels.

Figure 3:
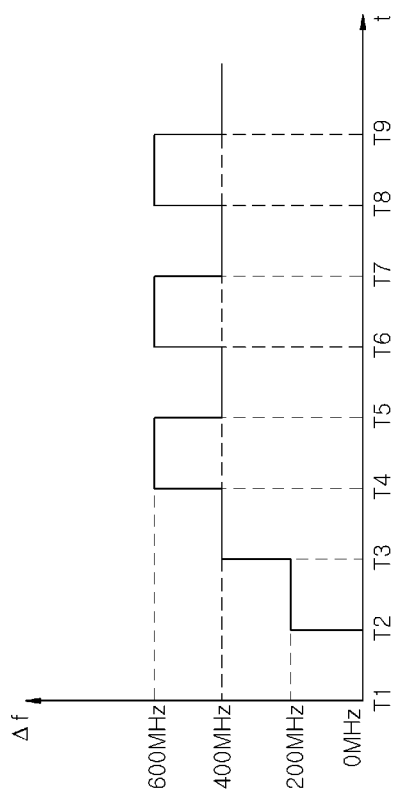
FIG. 3 is a graph illustrating an operation of the code signal generator of FIG. 2.

In the above example, where a frequency difference between the external clock signal ECLK and the internal clock signal RCLK is 400 MHz, the frequency difference in the graph of FIG. 3 converges at 400 MHz. In this case, therefore, the latch signal generator 132 may generate a latch signal LATEN having a logic "high" level when the first and second count signals CNT<1:2> stably have a logic level combination corresponding to the frequency difference of 400 MHz between the external clock signal ECLK and the internal clock signal RCLK. For example, the latch signal generator 132 may generate a latch signal LATEN having a logic "high" level at the point of time T9 after the up-counting operation and the down-counting operation of the first and second count signals CNT<1:2> are executed three times from the point of time T4 to the point of time T9. That is, the latch signal generator 132 may generate a latch signal LATEN having a logic "high" level when the first and second count signals CNT<1:2> stably converge on a logic level combination corresponding to the frequency difference of 400 MHz between the external clock signal ECLK and the internal clock signal RCLK.

The latch portion 133 may latch the first count signal CNT<1> having a logic "low" level and the second count signal CNT<2> having a logic "high" level in response to the latch signal LATEN having a logic "high" level, thereby outputting the latched first and second count signals CNT<1:2> as first and second pre-code signals RO<1:2> respectively.

The decoder 134 may decode the latched first count signal CNT<1> having a logic "low" level and the latched second count signal CNT<2> having a logic "high" level to generate the first to fourth input code signals TO<1:4> having a logic level combination (H, H, H, L). That is, the decoder 134 may generate the first to fourth input code signals TO<1:4> having a logic level combination (H, H, H, L) that corresponds to the frequency difference of 400 MHz between the external clock signal ECLK and the internal clock signal RCLK. The logic level combination (H, H, H, L) of the first to fourth input code signals TO<1:4> means that the first to third input code signals TO<1:3> has a logic "high" level and the fourth input code signal TO<4> has a logic "low" level.

Figure 5:
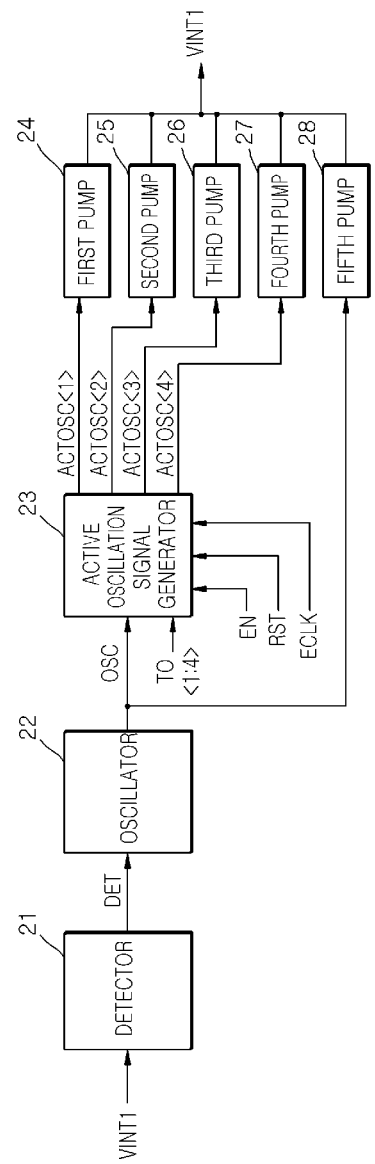
FIG. 5 is a block diagram illustrating an example of a first internal voltage generator included in the internal voltage generation circuit of FIG. 1.

Referring to FIG. 5, the first internal voltage generator 2 may be configured to include a detector 21, an oscillator 22, an active oscillation signal generator 23, and first to fifth pumps 24, 2526, 27, and 28.

The detector 21 may generate a detection signal DET enabled to have a logic "high" level when a first internal voltage signal VINT1 has a lower level than a predetermined level. The detection signal DET may be generated to have a logic "low" level when a level of the first internal voltage signal VINT1 is equal to or higher than the predetermined level. The oscillator 22 may receive the detection signal DET having a logic "high" level to generate an oscillation signal OSC that is periodically toggled. The active oscillation signal generator 23 may buffer the oscillation signal OSC to generate first to fourth active oscillation signals ACTOSC<1:4> selectively enabled according to a logic level combination of the first to fourth input code signals TO<1:4>. For example, in the event that the first input code signal TO<1> has a logic "high" level and the second to fourth input code signals TO<2:4> have a logic "low" level, the first active oscillation signal ACTOSC<1> corresponding to the first input code signal TO<1> may be selectively enabled and the second to fourth input code signals TO<2:4> may be disabled. The first to fourth active oscillation signals ACTOSC<1:4> are signals that are periodically toggled. The first to fourth pumps 24, 2526, and 27 may be selectively activated according to a logic level combination of the first to fourth active oscillation signals ACTOSC<1:4> to drive the first internal voltage signal VINT1. For example, the first pump 24 may amplify voltage and output the first internal voltage signal VINT1 when the first active oscillation signal ACTOSC<1> is toggled, and the second pump 25 may amplify voltage and output the first internal voltage signal VINT1 when the second active oscillation signal ACTOSC<2> is toggled. Similarly, the third pump 26 may amplify voltage and output the first internal voltage signal VINT1 when the third active oscillation signal ACTOSC<3> is toggled, and the fourth pump 27 may amplify voltage and output the first internal voltage signal VINT1 when the fourth active oscillation signal ACTOSC<4> is toggled. The fifth pump 28 may receive the oscillation signal OSC to amplify voltage and output the first internal voltage signal VINT1. That is, one of the first to fourth pumps 24, 25, . . . , 27 may be selectively activated by one of the first to fourth active oscillation signals ACTOSC<1:4> to output the first internal voltage signal VINT1, and the fifth pump 28 may output the first internal voltage signal VINT1 in response to the oscillation signal OSC.

Figure 6:
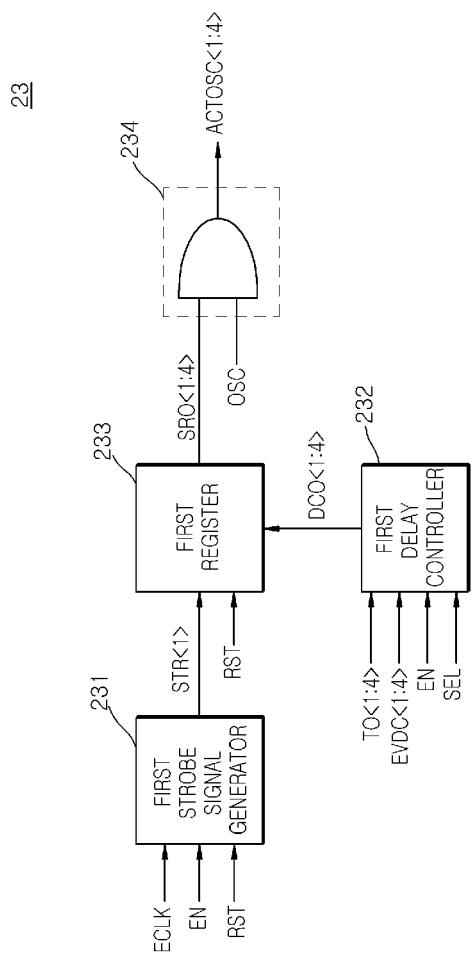
FIG. 6 is a block diagram illustrating an example of an active oscillation signal generator included in the first internal voltage generator of FIG. 5.

A configuration of the active oscillation signal generator 23 will be described hereinafter with reference to FIG. 6.

The active oscillation signal generator 23 may include a first strobe signal generator 231, a first delay controller 232, a first register 233 and a logic unit 234. The first strobe signal generator 231 may be initialized in response to the reset signal RST which is enabled during the power-up period. The first strobe signal generator 231 may generate a first strobe signal STR<1> in response to the enable signal EN which is enabled after the power-up period. The first strobe signal STR<1> may include pulses that are periodically generated in synchronization with the external clock signal ECLK. The first delay controller 232 may receive a selection signal SEL from an external device to generate first to fourth delay signals DCO<1:4> whose delay times are controlled according to a logic level combination of the first to fourth input code signals TO<1:4> or a logic level combination of first to fourth external code signals EVDC<1:4>. When the selection signal SEL is enabled, the delay times of the first to fourth delay signals DCO<1:4> may be controlled according to a logic level combination of the first to fourth input code signals TO<1:4>. When the selection signal SEL is disabled, the delay times of the first to fourth delay signals DCO<1:4> may be controlled according to a logic level combination of the first to fourth external code signals EVDC<1:4>. The above operation of the first delay controller 232 may be executed when the enable signal EN is enabled. In an embodiment of the present invention, the first register 233 may sequentially latch the first to fourth delay signals DCO<1:4> at a point of time when the pulse of the first strobe signal STR<1> is inputted and may output the latched first to fourth delay signals DCO<1:4> as first to fourth pre-active signals SRO<1:4>. The logic unit 234 may buffer the oscillation signal OSC according to a logic level combination of the first to fourth pre-active signals SRO<1:4> to generate the first to fourth active oscillation signals ACTOSC<1:4>.

Figure 7:
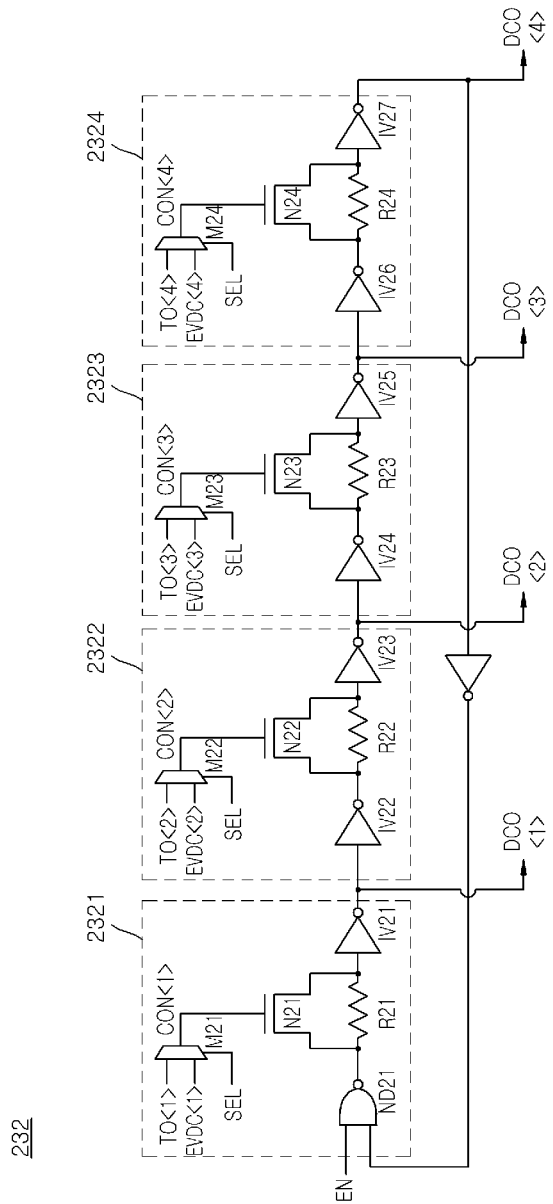
FIG. 7 is a circuit diagram illustrating an example of a first delay controller included in the active oscillation signal generator of FIG. 6.

A configuration of the first delay controller 232 will be described hereinafter with reference to FIG. 7.

The first delay controller 232 may be configured to include a first delay portion 2321, a second delay portion 2322, a third delay portion 2323 and a fourth delay portion 2324.

The first delay portion 2321 may be configured to include a multiplexer M21, a NAND gate ND21, an inverter IV21, a resistor R21 and an NMOS transistor N21. The multiplexer M21 may output the first input code signal TO<1> as a first control signal CON<1> when the selection signal SEL is enabled to have a logic "high" level and may output the first external code signal EVDC<1> as the first control signal CON<1> when the selection signal SEL is disabled to have a logic "low" level. The NAND gate ND21 may invert a complementary signal of the fourth delay signal DCO<4> when the enable signal EN has a logic "high" level. The inverter IV21 may invert an output signal of the NAND gate ND21. One terminal of the resistor R21 may be electrically connected to an output terminal of the NAND gate ND21 and the other terminal of the resistor R21 may be electrically connected to an input terminal of the inverter IV21. The NMOS transistor N21 may be electrically connected in parallel to the resistor R21 and may be turned on when the first control signal CON<1> has a logic "high" level. If it is assumed that a first delay time refers to a delay time of the NMOS transistor N21 and a second delay time refers to a delay time of the resistor R21, the first delay portion 2321 may retard the complementary signal of the fourth delay signal DCO<4> by the first delay time to generate the first delay signal DCO<1> when the first control signal CON<1> has a logic "high" level, and the first delay portion 2321 may retard the complementary signal of the fourth delay signal DCO<4> by the second delay time to generate the first delay signal DCO<1> when the first control signal CON<1> has a logic "low" level.

The second delay portion 2322 may be configured to include a multiplexer M22, an inverter IV22, an inverter IV23, a resistor R22 and an NMOS transistor N22. The multiplexer M22 may output the second input code signal TO<2> as a second control signal CON<2> when the selection signal SEL is enabled to have a logic "high" level and may output the second external code signal EVDC<2> as the second control signal CON<2> when the selection signal SEL is disabled to have a logic "low" level. The inverter IV22 may invert the first delay signal DCO<1>. The inverter IV23 may invert an output signal of the inverter IV22. One terminal of the resistor R22 may be electrically connected to an output terminal of the inverter IV22 and the other terminal of the resistor R22 may be electrically connected to an input terminal of the inverter IV23. The NMOS transistor N22 may be electrically connected in parallel to the resistor R22 and may be turned on when the second control signal CON<2> has a logic "high" level. If it is assumed that a first delay time refers to a delay time of the NMOS transistor N22 and a second delay time refers to a delay time of the resistor R22, the second delay portion 2322 may retard the first delay signal DCO<1> by the first delay time to generate the second delay signal DCO<2> when the second control signal CON<2> has a logic "high" level, and the second delay portion 2322 may retard the first delay signal DCO<1> by the second delay time to generate the second delay signal DCO<2> when the second control signal CON<2> has a logic "low" level.

The third delay portion 2323 may be configured to include a multiplexer M23, an inverter IV24, an inverter IV25, a resistor R23 and an NMOS transistor N23. The multiplexer M23 may output the third input code signal TO<3> as a third control signal CON<3> when the selection signal SEL is enabled to have a logic "high" level and may output the third external code signal EVDC<3> as the third control signal CON<3> when the selection signal SEL is disabled to have a logic "low" level. The inverter IV24 may invert the second delay signal DCO<2>. The inverter IV25 may invert an output signal of the inverter IV24. One terminal of the resistor R23 may be electrically connected to an output terminal of the inverter IV24 and the other terminal of the resistor R23 may be electrically connected to an input terminal of the inverter IV25. The NMOS transistor N23 may be electrically connected in parallel to the resistor R23 and may be turned on when the third control signal CON<3> has a logic "high" level. If it is assumed that a first delay time refers to a delay time of the NMOS transistor N23 and a second delay time refers to a delay time of the resistor R23, the third delay portion 2323 may retard the second delay signal DCO<2> by the first delay time to generate the third delay signal DCO<3> when the third control signal CON<3> has a logic "high" level, and the third delay portion 2323 may retard the second delay signal DCO<2> by the second delay time to generate the third delay signal DCO<3> when the third control signal CON<3> has a logic "low" level.

The fourth delay portion 2324 may be configured to include a multiplexer M24, an inverter IV26, an inverter IV27, a resistor R24 and an NMOS transistor N24. The multiplexer M24 may output the fourth input code signal TO<4> as a fourth control signal CON<4> when the selection signal SEL is enabled to have a logic "high" level and may output the fourth external code signal EVDC<4> as the fourth control signal CON<4> when the selection signal SEL is disabled to have a logic "low" level. The inverter IV26 may invert the third delay signal DCO<3>. The inverter IV27 may invert an output signal of the inverter IV26. One terminal of the resistor R24 may be electrically connected to an output terminal of the inverter IV26 and the other terminal of the resistor R24 may be electrically connected to an input terminal of the inverter IV27. The NMOS transistor N24 may be electrically connected in parallel to the resistor R24 and may be turned on when the fourth control signal CON<4> has a logic "high" level. If it is assumed that a first delay time refers to a delay time of the NMOS transistor N24 and a second delay time refers to a delay time of the resistor R24, the fourth delay portion 2324 may retard the third delay signal DCO<3> by the first delay time to generate the fourth delay signal DCO<4> when the fourth control signal CON<4> has a logic "high" level, and the fourth delay portion 2324 may retard the third delay signal DCO<3> by the second delay time to generate the fourth delay signal DCO<4> when the fourth control signal CON<4> has a logic "low" level.

In various embodiments of the present invention, the delay of each of the NAND gate ND21 and the inverters IV21, IV22, . . . , IV27 may be substantially equal to each other, and resistance values of the resistors R21, R22, . . . , R24 may be substantially equal to each other. Further, the first delay time may be set to be less than the second delay time.

Figure 8:
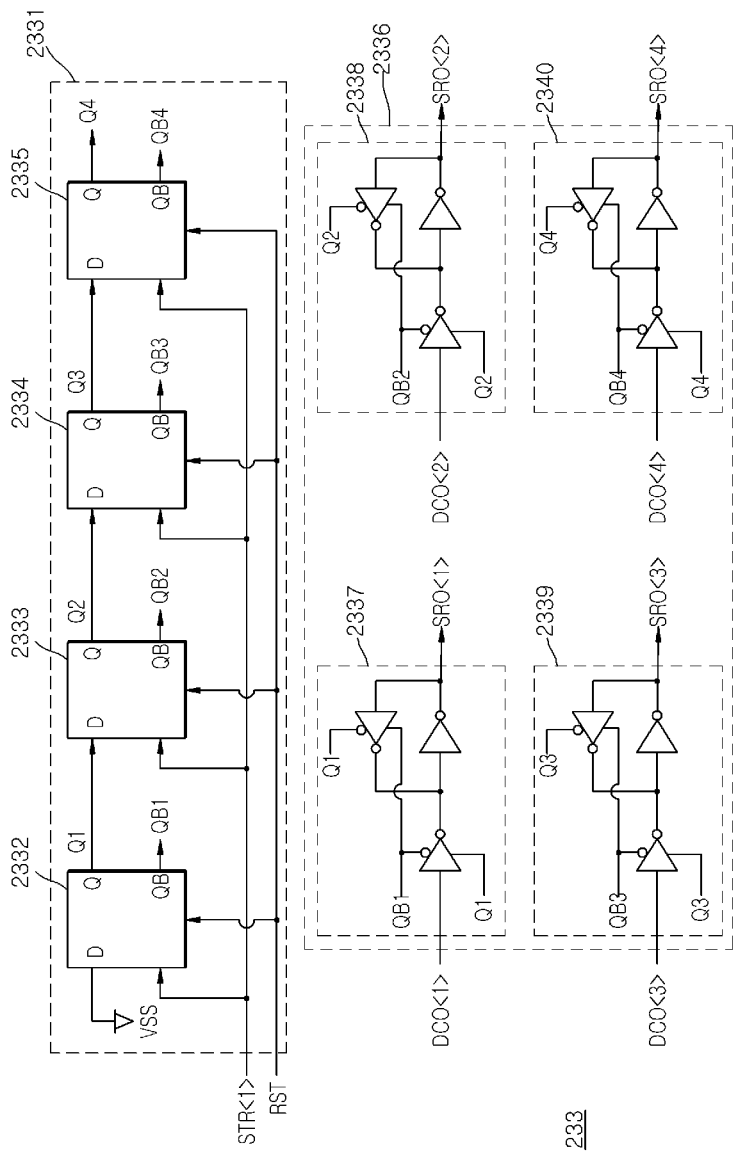
FIG. 8 is a circuit diagram illustrating an example of a first register included in the active oscillation signal generator of FIG. 6.

A configuration of the first register 233 will be described hereinafter with reference to FIG. 8.

The first register 233 may be configured to include a transmission signal generator 2331 and a pre-active signal generator 2336.

The transmission signal generator 2331 may include a first flip-flop 2332, a second flip-flop 2333, a third flip-flop 2334 and a fourth flip-flop 2335. The first flip-flop 2332 may output a ground voltage signal VSS as a first transmission signal Q1 in response to a pulse of the first strobe signal STR<1> and may also generate a first complementary transmission signal QB1 that is the inverse of the first transmission signal Q1. The second flip-flop 2333 may output the first transmission signal Q1 as a second transmission signal Q2 in response to a pulse of the first strobe signal STR<1> and may also generate a second complementary transmission signal QB2 that is the inverse of the second transmission signal Q2. The third flip-flop 2334 may output the second transmission signal Q2 as a third transmission signal Q3 in response to a pulse of the first strobe signal STR<1> and may also generate a third complementary transmission signal QB3 that is the inverse of the third transmission signal Q3. The fourth flip-flop 2335 may output the third transmission signal Q3 as a fourth transmission signal Q4 in response to a pulse of the first strobe signal STR<1> and may also generate a fourth complementary transmission signal QB4 that is the inverse of the fourth transmission signal Q4. The first flip-flop 2332 may receive the reset signal RST having a logic "high" level during the power-up period to change the level of the first transmission signal Q1 into a logic "high" level and to change the level of the first complementary transmission signal QB1 into a logic "low" level. In addition, the second to fourth flip-flops 2333, 2334, and 2335 may receive the reset signal RST having a logic "high" level during the power-up period to change the levels of the second to fourth transmission signals Q2, Q3, and Q4 into a logic "low" level and to change the levels of the second to fourth complementary transmission signals QB2, QB3, and QB4 into a logic "high" level.

The pre-active signal generator 2336 may include a first buffer 2337, a second buffer 2338, a third buffer 2339 and a fourth buffer 2340. The first buffer 2337 may latch the first delay signal DCO<1> at a transition point when the first transmission signal Q1 changes from a logic "high" level to a logic "low" level, thereby generating the first pre-active signal SRO<1>. The second buffer 2338 may latch the second delay signal DCO<2> at a transition point when the second transmission signal Q2 changes from a logic "high" level to a logic "low" level, thereby generating the second pre-active signal SRO<2>. The third buffer 2339 may latch the third delay signal DCO<3> at a transition point when the third transmission signal Q3 changes from a logic "high" level to a logic "low" level, thereby generating the third pre-active signal SRO<3>. The fourth buffer 2340 may latch the fourth delay signal DCO<4> at a transition point when the fourth transmission signal Q4 changes from a logic "high" level to a logic "low" level, thereby generating the fourth pre-active signal SRO<4>.

Figure 9:
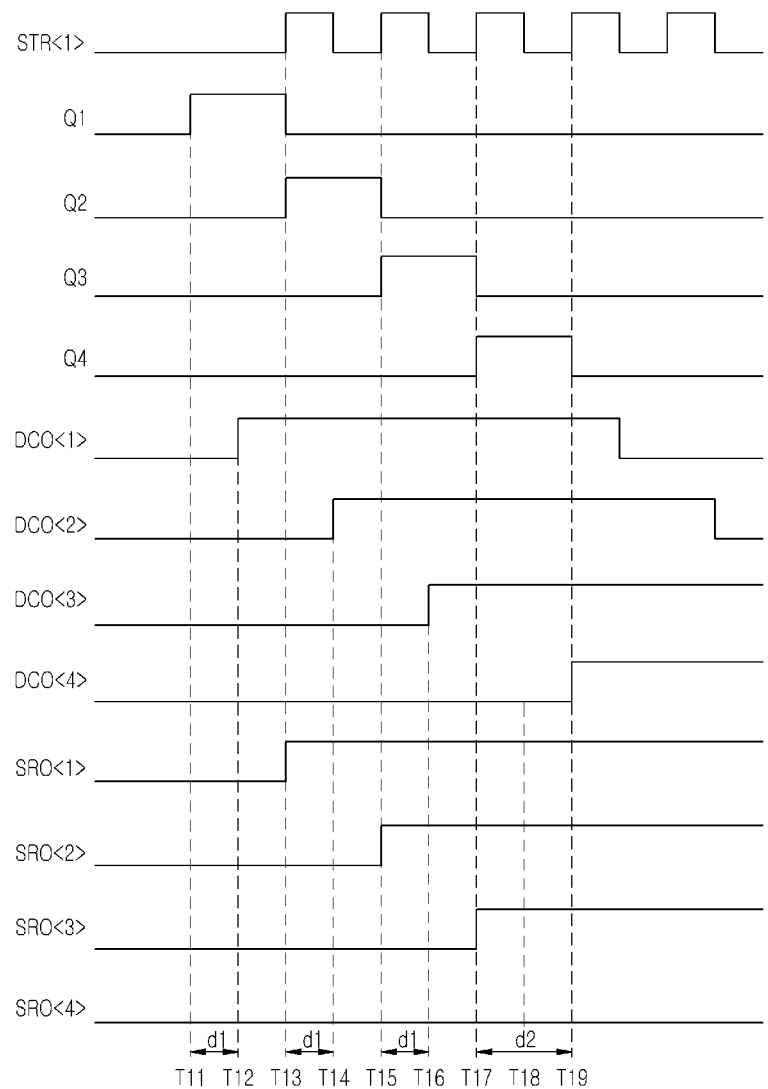
FIG. 9 is a timing diagram illustrating an operation of the active oscillation signal generator of FIG. 6.

Hereinafter, an operation of the active oscillation signal generator 23 as set forth above will be described with reference to FIG. 9 illustrating an example that the first to fourth input code signals TO<1:4> have a logic level combination (H, H, H, L) to generate the first to fourth pre-active signals SRO<1:4>.

At a point of time T11, the transmission signal generator 2331 may receive the reset signal RST to generate the first transmission signal Q1 having a logic "high" level.

Next, because the first input code signal TO<1> has a logic "high" level, the first delay portion 2321 of the first delay controller 232 may retard the fourth delay signal DCO<4> by a first delay time d1 from the point of time T11 to generate the first delay signal DCO<1> having a logic "high" level at a point of time T12.

At a point of time T13, the transmission signal generator 2331 may receive a pulse of the first strobe signal STR<1> to generate the first transmission signal Q1 having a logic "low" level and to generate the second transmission signal Q2 having a logic "high" level. The first register 233 may latch the first delay signal DCO<1>, which is generated to have a logic "high" level at the point of time 12, to generate the first pre-active signal SRO<1> having a logic "high" level at the point of time T13.

Next, because the second input code signal TO<2> has a logic "high" level, the second delay portion 2322 of the first delay controller 232 may retard the first delay signal DCO<1> by the first delay time d1 from the point of time T13 to generate the second delay signal DCO<2> having a logic "high" level at a point of time T14.

At a point of time T15, the transmission signal generator 2331 may receive a pulse of the first strobe signal STR<1> to generate the second transmission signal Q2 having a logic "low" level and to generate the third transmission signal Q3 having a logic "high" level. The first register 233 may latch the second delay signal DCO<2>, which is generated to have a logic "high" level at the point of time 14, to generate the second pre-active signal SRO<2> having a logic "high" level at the point of time T15.

Next, because the third input code signal TO<3> has a logic "high" level, the third delay portion 2323 of the first delay controller 232 may retard the second delay signal DCO<2> by the first delay time d1 from the point of time T15 to generate the third delay signal DCO<3> having a logic "high" level at a point of time T16.

At a point of time T17, the transmission signal generator 2331 may receive a pulse of the first strobe signal STR<1> to generate the third transmission signal Q3 having a logic "low" level and to generate the fourth transmission signal Q4 having a logic "high" level. The first register 233 may latch the third delay signal DCO<3>, which is generated to have a logic "high" level at the point of time 16, to generate the third pre-active signal SRO<3> having a logic "high" level at the point of time T17.

At a point of time T19, the transmission signal generator 2331 may receive a pulse of the first strobe signal STR<1> to generate the fourth transmission signal Q4 having a logic "low" level. Because the fourth input code signal TO<4> has a logic "low" level, the fourth delay portion 2324 of the first delay controller 232 may retard the third delay signal DCO<3> by a second delay time d2 from the point of time T17 to generate the fourth delay signal DCO<4> having a logic "high" level at the point of time T19. The first register 233 may latch the fourth delay signal DCO<4> having a logic "low" level at the point of time T18 to generate the fourth pre-active signal SRO<4> having a logic "low" level. That is, the first register 233 may generate the first to fourth pre-active signals SRO<1:4> having a logic level combination (H, H, H, L). The logic level combination (H, H, H, L) of the first to fourth pre-active signals SRO<1:4> means that each of the first to third pre-active signals SRO<1:3> has a logic "high" level and the fourth pre-active signal SRO<4> has a logic "low" level.

Figure 10:
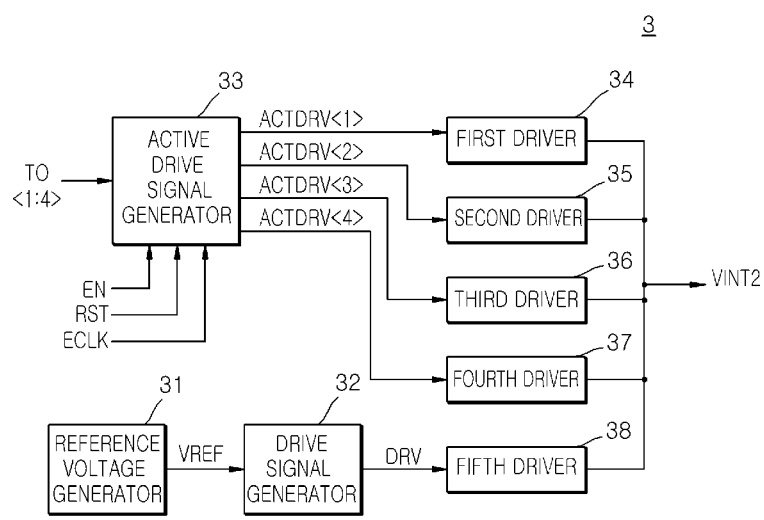
FIG. 10 is a block diagram illustrating an example of a second internal voltage generator included in the internal voltage generation circuit of FIG. 1.

Referring to FIG. 10, the second internal voltage generator 3 may include a reference voltage generator 31, a drive signal generator 32, an active drive signal generator 33, and first to fifth drivers 34, 35 36, 37, and 38.

The reference voltage generator 31 may generate a reference voltage signal VREF that is relatively less sensitive to process/voltage/temperature (PVT) conditions to substantially have a constant voltage level. The drive signal generator 32 may control a level of the reference voltage signal VREF to generate a drive signal DRV. The active drive signal generator 33 may generate first to fourth active drive signals ACTDRV<1:4> selectively enabled according to a logic level combination of the first to fourth input code signals TO<1:4>. The first driver 34 may drive the second internal voltage signal VINT2 when the first active drive signal ACTDRV<1> is enabled, and the second driver 35 may drive the second internal voltage signal VINT2 when the second active drive signal ACTDRV<2> is enabled. Similarly, the third driver 36 may drive the second internal voltage signal VINT2 when the third active drive signal ACTDRV<3> is enabled, and the fourth driver 37 may drive the second internal voltage signal VINT2 when the fourth active drive signal ACTDRV<4> is enabled. The fifth driver 38 may receive the drive signal DRV to drive the second internal voltage signal VINT2. That is, one of the first to fourth drivers 34, 35, 36, 37 may be selectively activated by the corresponding one of the first to fourth active drive signals ACTDRV<1:4> to drive the second internal voltage signal VINT2, and the fifth driver 38 may drive the second internal voltage signal VINT2 in response to the drive signal DRV.

Figure 11:
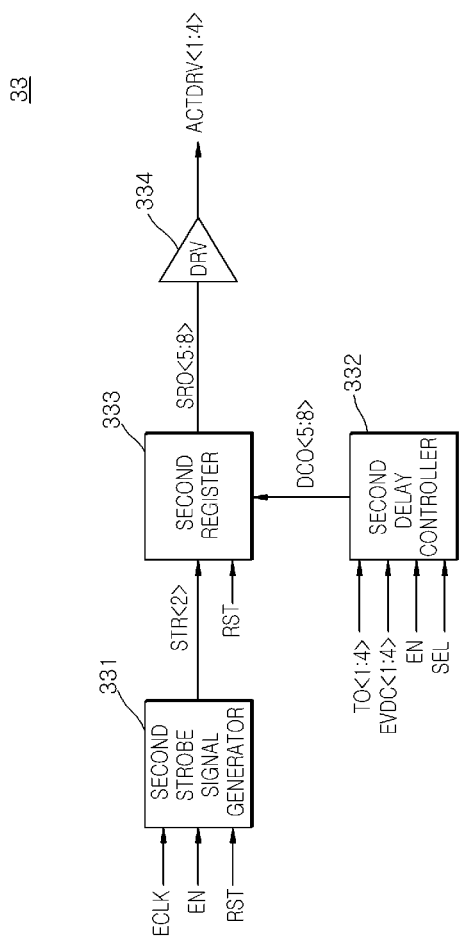
FIG. 11 is a block diagram illustrating an example of an active drive signal generator included in the second internal voltage generator of FIG. 10.

A configuration of the active drive signal generator 33 will be described hereinafter with reference to FIG. 11.

The active drive signal generator 33 may include a second strobe signal generator 331, a second delay controller 332, a second register 333 and a driver 334. The second strobe signal generator 331 may be initialized in response to the reset signal RST which is enabled during the power-up period. The second strobe signal generator 331 may generate a second strobe signal STR<2> in response to the enable signal EN which is enabled after the power-up period. The second strobe signal STR<2> may include pulses that are periodically generated in synchronization with the external clock signal ECLK. The second delay controller 332 may receive the selection signal SEL from an external device to generate fifth to eighth delay signals DCO<5:8> whose delay times are controlled according to a logic level combination of the first to fourth input code signals TO<1:4> or a logic level combination of the first to fourth external code signals EVDC<1:4>. When the selection signal SEL is enabled, the delay times of the fifth to eighth delay signals DCO<5:8> may be controlled according to a logic level combination of the first to fourth input code signals TO<1:4>. When the selection signal SEL is disabled, the delay times of the fifth to eighth delay signals DCO<5:8> may be controlled according to a logic level combination of the first to fourth external code signals EVDC<1:4>. The above operation of the second delay controller 332 may be executed when the enable signal EN is enabled. In an embodiment of the present invention, the second register 333 may sequentially latch the fifth to eighth delay signals DCO<5:8> at a point of time when the pulse of the second strobe signal STR<2> is inputted and may output the latched fifth to eighth delay signals DCO<5:8> as fifth to eighth pre-active signals SRO<5:8>. The driver 334 may buffer the fifth to eighth pre-active signals SRO<5:8> to generate the first to fourth active drive signals ACTDRV<1:4>. The second delay controller 332 may have substantially the same configuration as the first delay controller 232 illustrated in FIG. 6. Thus, detailed descriptions to the second delay controller 332 will be omitted in the specification. The second register 333 may also have substantially the same configuration as the first register 233 illustrated in FIG. 7. Thus, detailed descriptions to the second register 333 will be omitted in the specification.

Hereinafter, an operation of the internal voltage generation circuit as set forth above will be described with reference to FIGS. 1 to 11 in conjunction with an example that the first internal voltage signal VINT1 is driven when a frequency difference between the external clock signal ECLK and the internal clock signal RCLK is 400 megahertz (MHz).

The internal clock generator 11 of the code signal generator 1 may generate the internal clock signal RCLK according to a level of the input voltage signal OCV. The comparator 12 may compare the frequency of the external clock signal ECLK with the frequency of the internal clock signal RCLK to control the enable pulse width of the frequency difference signal FD. The code converter 13 may generate the first and second count signals CNT<1:2> that are generated by performing a counting operation during the enable pulse width of the frequency difference signal FD to have a logic level combination (L, H). Further, the code converter 13 may decode the first and second count signals CNT<1:2> having a logic level combination (L, H) to generate the first to fourth input code signals TO<1:4> having a logic level combination (H, H, H, L). The logic level combination (L, H) of the first and second count signals CNT<1:2> means that the first count signal CNT<1> has a logic "low" level and the second count signal CNT<2> has a logic "high" level. Further, the logic level combination (H, H, H, L) of the first to fourth input code signals TO<1:4> means that each of the first to third input code signals TO<1:3> has a logic "high" level and the fourth input code signals TO<4> has a logic "low" level.

The active oscillation signal generator 23 of the first internal voltage generator 2 may generate the first to fourth active oscillation signals ACTOSC<1:4> having a logic level combination (H, H, H, L) because the first to fourth input code signals TO<1:4> have a logic level combination (H, H, H, L). The level combination (H, H, H, L) of the first to fourth active oscillation signals ACTOSC<1:4> means that each of the first to third active oscillation signals ACTOSC<1:3> has a logic "high" level and the fourth active oscillation signal ACTOSC<4> has a logic "low" level. The oscillation signal OSC is generated to be periodically toggled. Thus, the first to third pumps 24, 25 and 26 and the fifth pump 28 may be activated and output the first internal voltage signal VINT1, and the fourth pump 27 may be inactivated.

As described above, the internal voltage generation circuit according to an embodiment of the present invention may selectively activate the pumps and drivers generating the internal voltages according to a frequency of the external clock signal ECLK. Thus, when the internal voltage generation circuit operates at a high speed in response to the external clock signal ECLK having a high frequency, activation of the pumps and drivers may be maximized, and when the internal voltage generation circuit operates at a low speed in response to the external clock signal ECLK having a low frequency, the power consumption of the internal voltage generation circuit may be reduced.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. An internal voltage generation circuit, the circuit comprising:
   a comparator configured to generate a frequency difference signal, wherein an enable period is controlled according to a frequency difference between an external clock signal and an internal clock signal; and
   a code converter configured to count logic levels of count signals and generate input code signals from the count signals,
   wherein the input code signals control a drivability for driving an internal voltage signal,
   wherein the code converter includes:
      a counter configured to output the count signals that are obtained through a counting operation performing during the enable period of the frequency difference signal;
      a latch signal generator configured to generate a latch signal which is enabled when a logic level combination of the count signals corresponds to a logic level combination corresponding to the frequency difference between the external clock signal and the internal clock signal;
      a latch portion configured to latch the count signals in response to the latch signal and output the latched count signals as pre-code signals; and
      a decoder configured to decode the pre-code signals to generate the input code signals.

2. The circuit of claim 1, further comprising an internal clock generator configured to generate the internal clock signal periodically toggled in response to a level of an input voltage signal supplied by an external device.

3. The circuit of claim 2, wherein a frequency of the internal clock signal is controlled according to the level of the input voltage signal.

4. The circuit of claim 1, wherein the latch signal is enabled when the number of times the same logic level combinations of the count signals are repeatedly generated is equal to a predetermined number.

5. The circuit of claim 1, further comprising an internal voltage generator configured to be selectively activated according to a logic level combination of the input code signals to drive the internal voltage signal.

6. An internal voltage generation circuit, the circuit comprising:
   a comparator configured to generate a frequency difference signal, wherein the pulse interval of the frequency difference signal is controlled according to a frequency difference between an external clock signal and an internal clock signal; and
   a code converter configured to generate count signals that are counted whenever the frequency difference signal is toggled and generate input code signals from the count signals,
   wherein the input code signals control a drivability for driving an internal voltage signal,
   wherein the code converter includes:
      a counter configured to output the count signals that are counted by the number that the frequency difference signal is toggled;
      a latch signal generator configured to generate a latch signal which is enabled when a logic level combination of the count signals corresponds to a logic level combination corresponding to the frequency difference between the external clock signal and the internal clock signal;

a latch portion configured to latch the count signals in response to the latch signal and output the latched count signals as pre-code signals; and a decoder configured to decode the pre-code signals to generate the input code signals.

7. The circuit of claim 6, further comprising an internal clock generator configured to generate the internal clock signal periodically toggled in response to a level of an input voltage signal supplied by an external device.

8. The circuit of claim 7, wherein a frequency of the internal clock signal is controlled according to the level of the input voltage signal.

9. The circuit of claim 6, wherein the latch signal is enabled when the number of times the same logic level combination of the count signals are repeatedly generated is equal to a predetermined number.

10. The circuit of claim 6, further comprising an internal voltage generator configured to be selectively activated according to a logic level combination of the input code signals to drive the internal voltage signal.

* * * * *